United States Patent
Miyazaki

(10) Patent No.: US 9,606,461 B2
(45) Date of Patent: Mar. 28, 2017

(54) MEASURING APPARATUS, MEASURING METHOD, LITHOGRAPHY APPARATUS, AND METHOD OF MANUFACTURING ARTICLE

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 142 days.

(21) Appl. No.: 14/476,317

(22) Filed: Sep. 3, 2014

(65) Prior Publication Data

US 2015/0070679 A1 Mar. 12, 2015

(30) Foreign Application Priority Data

Sep. 6, 2013 (JP) .................................. 2013-185706

(51) Int. Cl.
*G03F 7/20* (2006.01)
*G03F 9/00* (2006.01)

(52) U.S. Cl.
CPC .................. *G03F 9/7088* (2013.01)

(58) Field of Classification Search
CPC .... G03F 9/7088; G03F 9/7076; G03F 9/7003; G03F 9/7084; G03F 9/70
See application file for complete search history.

(56) References Cited

U.S. PATENT DOCUMENTS

| 5,849,441 A * | 12/1998 | Nara .......................... G03F 9/00 430/22 |
| 2002/0036777 A1* | 3/2002 | Tanaka .................. G03F 9/7065 356/401 |
| 2003/0054574 A1* | 3/2003 | Tanaka .................. G03F 9/7003 438/4 |
| 2009/0208855 A1* | 8/2009 | Koga .................... G01B 11/002 430/30 |

FOREIGN PATENT DOCUMENTS

JP 11-329943 A 11/1999

OTHER PUBLICATIONS

Machine translation of JP 11-329943, 1999.*

* cited by examiner

*Primary Examiner* — Steven H Whitesell Gordon
(74) *Attorney, Agent, or Firm* — Rossi, Kimms & McDowell LLP

(57) ABSTRACT

The present invention provides a measuring apparatus for measuring a position of an alignment mark formed on a substrate and including a first mark having position information in a first direction and a second mark having position information in a second direction different from the first direction, the apparatus including a detector configured to detect an image of the alignment mark, a controller configured to control movement of a stage for holding the substrate and detection by the detector, and a processor configured to obtain a position of the alignment mark whose image is detected by the detector, wherein the controller is configured to cause the detector to detect the image of the alignment mark with the stage moving in the first direction, and cause the detector to detect the image of the alignment mark with the stage moving in the second direction.

18 Claims, 9 Drawing Sheets

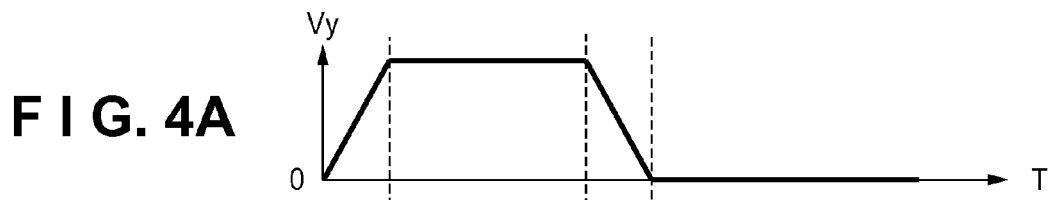
F I G. 4A
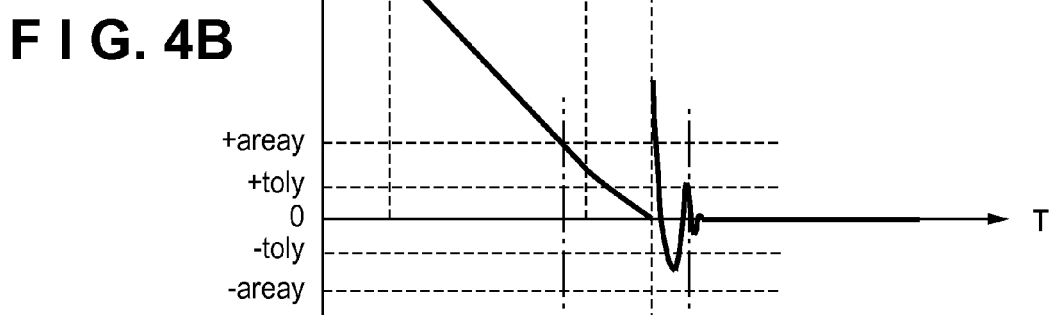
F I G. 4B
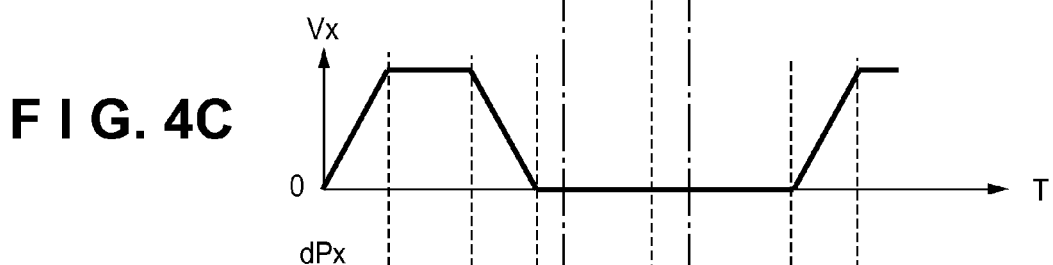
F I G. 4C
F I G. 4D
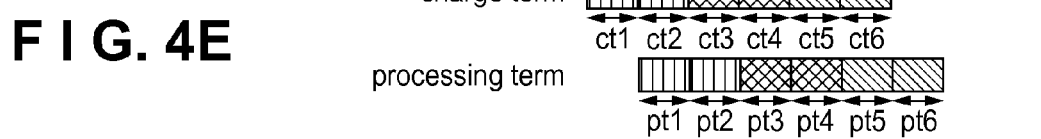
F I G. 4E

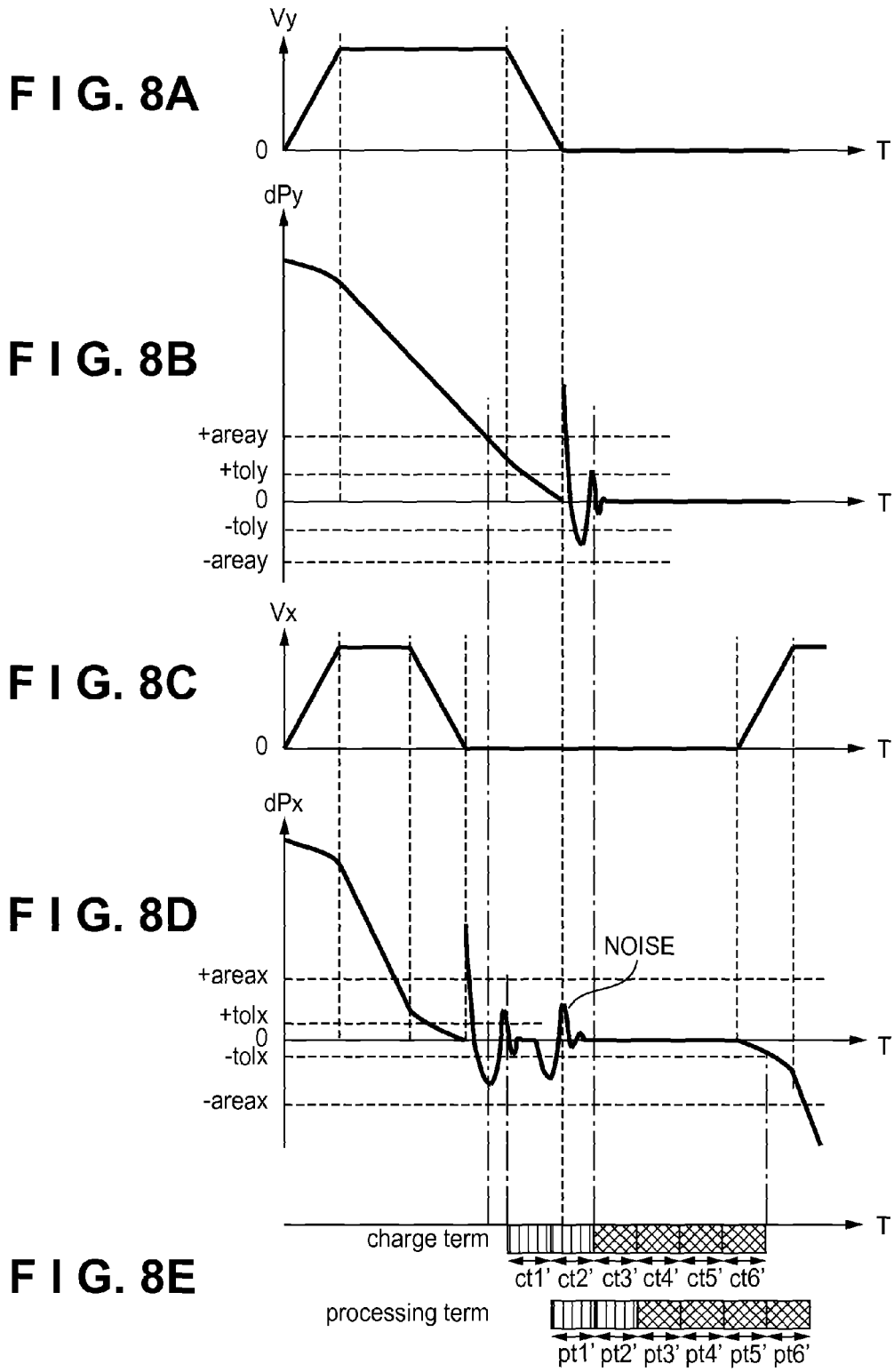

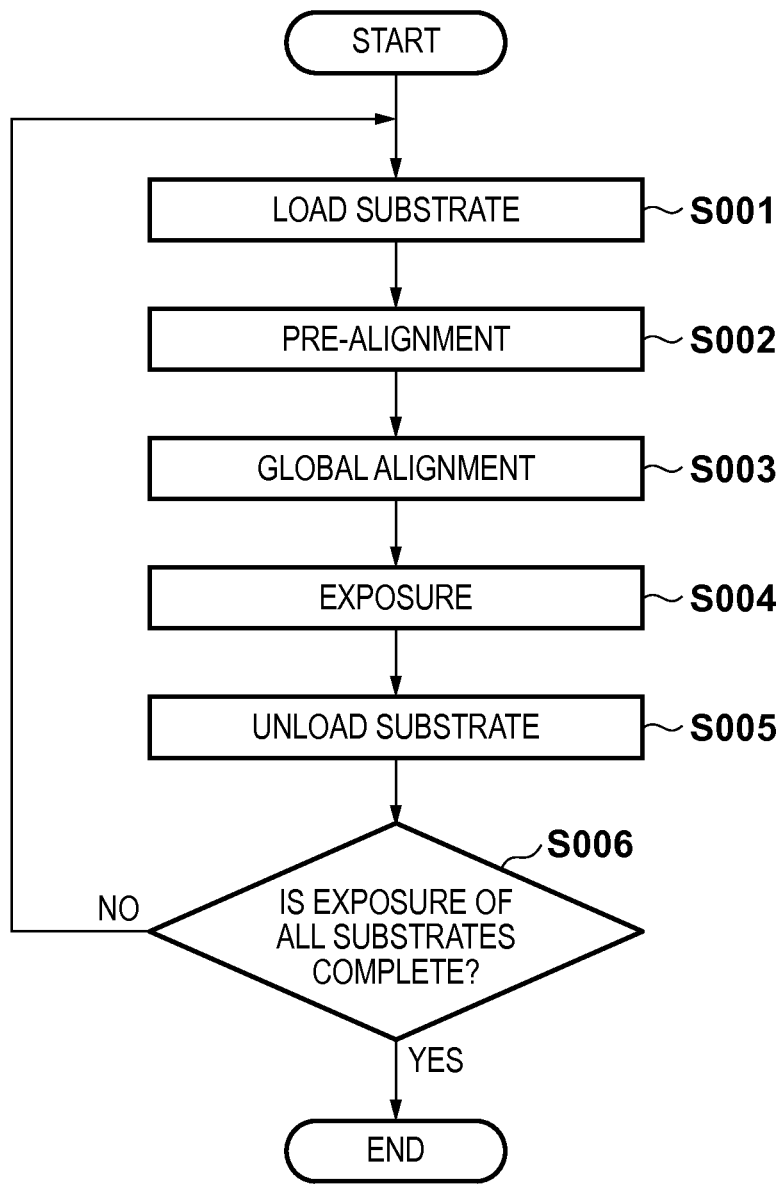

MEASURING APPARATUS, MEASURING METHOD, LITHOGRAPHY APPARATUS, AND METHOD OF MANUFACTURING ARTICLE

BACKGROUND OF THE INVENTION

Field of the Invention

The present invention relates to a measuring apparatus, a measuring method, a lithography apparatus, and a method of manufacturing an article.

Description of the Related Art

Recently, as the micropatterning and integration of semiconductor devices such as ICs and LSIs advance, the accuracy and performance of a lithography apparatus such as an exposure apparatus are improving. As a lithography apparatus for manufacturing a semiconductor device, an exposure apparatus called a stepper or scanner is often used. In this exposure apparatus, a pattern of an original such as a mask or reticle is sequentially transferred to a plurality of portions (shot regions) of a substrate such as a wafer while the substrate is driven step by step. An exposure apparatus which performs this transfer at once is called a stepper, and an exposure apparatus which performs this transfer while scanning the substrate is called a scanner.

In the lithography apparatus, the accuracy of alignment between the original and substrate is an important element having a direct influence on the performance of the lithography apparatus. Therefore, a technique which aligns the pattern of the original and a pattern formed on the substrate on a nanometer order is required. The lithography apparatus is also required to improve the throughput (the number of substrates which can be processed within a unit time) from the viewpoint of the productivity.

As described above, the lithography apparatus is required to implement accurate alignment while improving the throughput. Therefore, a technique which measures an alignment mark on a substrate by using a sensor without stopping a stage holding the substrate is proposed in Japanese Patent Laid-Open No. 11-329943. Japanese Patent Laid-Open No. 11-329943 has disclosed a technique in which when an alignment mark has position information of one direction, (an image of) the alignment mark is measured by using a sensor while scanning the alignment mark in a direction perpendicular to the one direction. Since this technique can shorten the time (processing time) necessary to measure the alignment mark, it is possible to improve the throughput while implementing accurate alignment.

This related art is an effective technique when an alignment mark has position information in only one direction (for example, when elements of the alignment mark are arranged in only one direction). However, when an alignment mark has position information in two directions, the alignment mark must be measured after the substrate is stopped. Accordingly, this related art is sometimes unable to improve the throughput depending on the type of alignment mark.

SUMMARY OF THE INVENTION

The present invention provides, for example, a technique advantageous in terms of time required for measuring a position of an alignment mark formed on a substrate.

According to one aspect of the present invention, there is provided a measuring apparatus for measuring a position of an alignment mark formed on a substrate and including a first mark having position information in a first direction and a second mark having position information in a second direction different from the first direction, the apparatus including a stage configured to hold the substrate and to be movable, a detector configured to detect an image of the alignment mark, a controller configured to control movement of the stage and detection by the detector, and a processor configured to obtain a position of the alignment mark whose image is detected by the detector, wherein the controller is configured to cause the detector to detect the image of the alignment mark with the stage moving in the first direction, and cause the detector to detect the image of the alignment mark with the stage moving in the second direction, and the processor is configured to obtain a position of the second mark in the second direction based on an image of the second mark detected by the detector with the stage moving in the first direction, and obtain a position of the first mark in the first direction based on an image of the first mark detected by the detector with the stage moving in the second direction.

Further aspects of the present invention will become apparent from the following description of exemplary embodiments with reference to the attached drawings.

BRIEF DESCRIPTION OF THE DRAWINGS

FIGS. 4A to 4E are views for explaining the moving pattern of a substrate stage and the charge timings of an image sensor when sensing an image of the alignment mark.

FIGS. 8A to 8E are views for explaining the moving pattern of the substrate stage and the charge timings of the image sensor when sensing an image of the alignment mark.

FIG. 10 is a flowchart for explaining the operation of the exposure apparatus.

DESCRIPTION OF THE EMBODIMENTS

Figure 1:
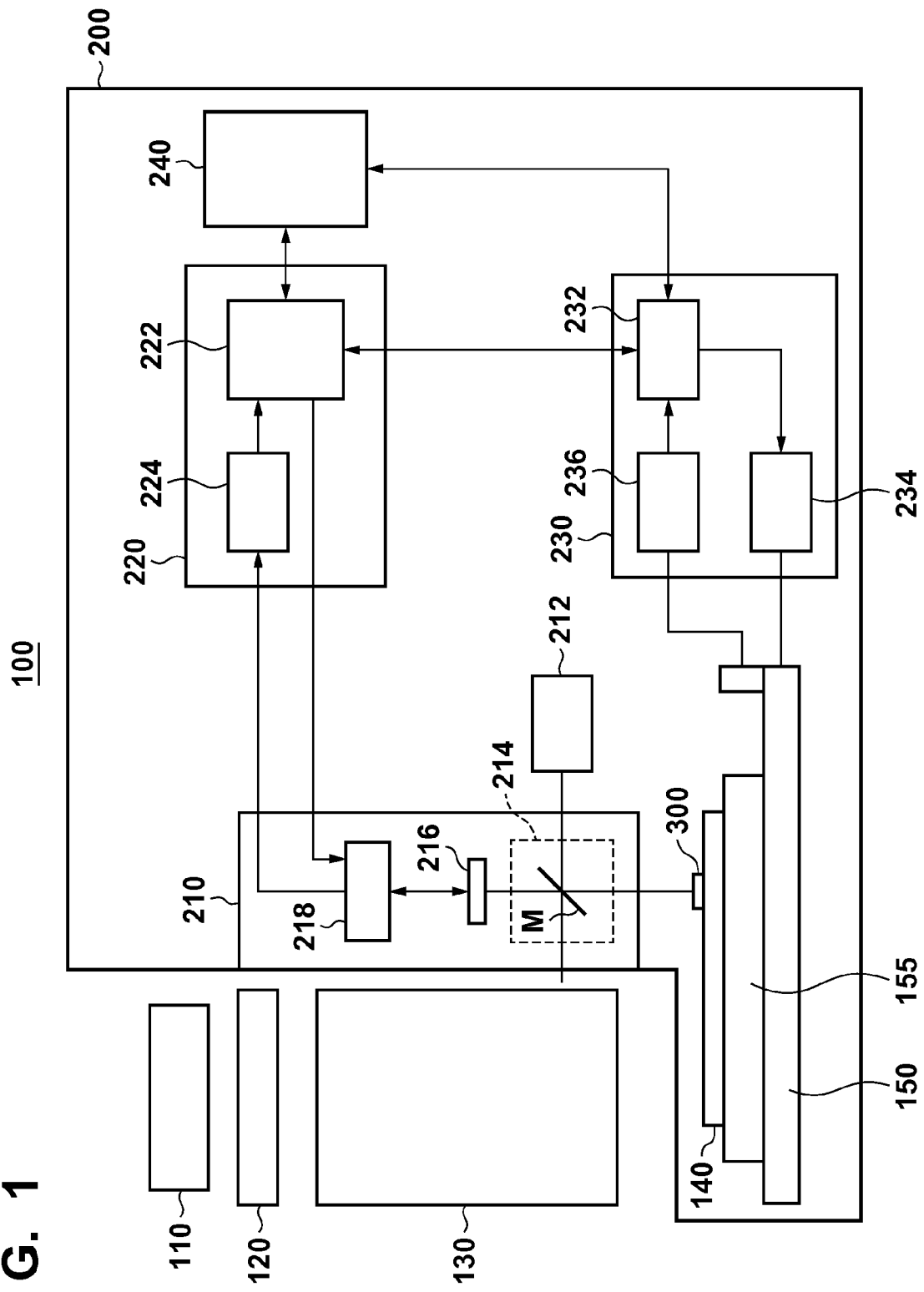
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 according to an aspect of the present invention. The exposure apparatus 100 is a lithography apparatus for forming a pattern on a substrate. The exposure apparatus 100 includes an illumination optical system 110, a reticle stage (not shown) which can move while holding a reticle 120, a projection optical system 130, a substrate stage 150 which can move while holding a substrate 140, and a measuring apparatus 200. The measuring apparatus 200 includes a detector 210, alignment controller 220, stage controller 230, and main controller 240. Note that in this embodiment, the main controller 240 controls not only the operation of the measuring apparatus 200, but also the operation of the exposure apparatus 100.

The exposure apparatus 100 aligns the reticle (original) 120 and substrate 140, illuminates the reticle 120 by the illumination optical system 110, and transfers (a latent image pattern as) a pattern of the reticle 120 to the substrate 140 via the projection optical system 130.

Figure 2:
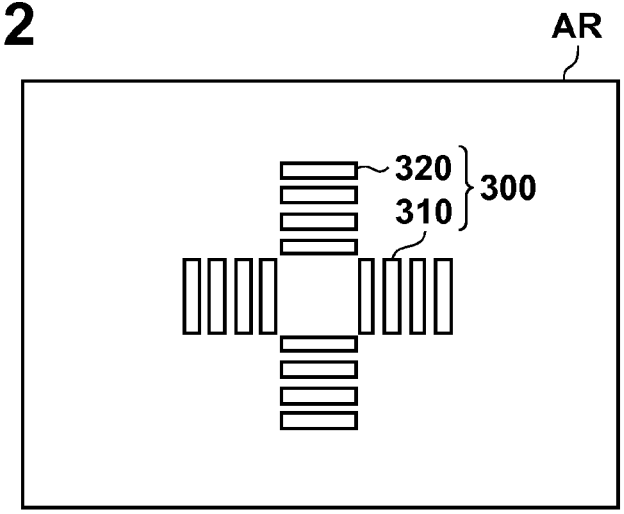
FIG. 2 is a view showing an example of an alignment mark formed on a substrate.

The substrate 140 is held on the substrate stage 150 movable in the X and Y directions (first and second directions), via a chuck 155 which chucks the substrate 140. A plurality of alignment marks 300 are formed on the substrate 140 in order to align it. As shown in FIG. 2, each alignment mark 300 has position information of two directions, that is, the X and Y directions. In other words, the alignment mark 300 includes an X mark (first mark) 310 having X-direction position information, and a Y mark (second mark) 320 having Y-direction position information. An X-direction position (position information) can be obtained from the X mark 310 in which a plurality of elements are arranged along the X direction, and a Y-direction position (position information) can be obtained from the Y mark 320 in which a plurality of elements are arranged along the Y direction. The X and Y directions are perpendicular to each other.

The detector 210 includes a light source 212, scope 214, image sensor 216, and image sensing controller 218. Light from the light source 212 is guided to the scope 214 including a half mirror M and various optical members via a fiber and dedicated optical system, and illuminates the alignment mark 300. Light reflected by the alignment mark 300 is projected to the image sensor 216 via the scope 214. Thus, the scope 214 forms an image of the alignment mark 300 of a position measurement target (the alignment mark of a target) on the image sensing surface of the image sensor 216.

The image of the alignment mark 300 on the substrate, which is sensed by the image sensor 216, is photoelectrically converted. The time during which the image sensor 216 is charged with the light reflected by the alignment mark 300 is transmitted from the main controller 240 to an alignment processor 222 of the alignment controller 220, and controlled by the image sensing controller 218. Also, the timing at which the image sensor 216 is charged with the light reflected by the alignment mark 300 is transmitted from a stage processor 232 of the stage controller 230 to the alignment processor 222, and designated to the image sensing controller 218.

The signal photoelectrically converted by the image sensor 216 is A/D-converted by the image sensing controller 218, and stored as a digital signal in a memory 224 of the alignment controller 220. In this embodiment, an image of the same alignment mark 300 is sensed a plurality of times in order to increase the position measurement accuracy of the alignment mark 300. The memory 224 is so configured as to be able to store a plurality of digital signals. In this embodiment, the memory 224 stores a digital signal corresponding to an image of an alignment mark for which the position in only the X direction can be obtained. Also, the memory 224 stores a digital signal corresponding to an image of an alignment mark for which the position in only the Y direction can be obtained. Furthermore, the memory 224 stores a digital signal corresponding to an image of an alignment mark for which the positions in two directions, that is, the X and Y directions can be obtained.

Based on the digital signals stored in the memory 224, the alignment processor 222 obtains the position (central position) of the alignment mark 300. For example, from the digital signals separately stored in the memory 224 for the X and Y directions, the alignment processor 222 obtains the position of the alignment mark 300 (the X mark 310) in the X direction, and the position of the alignment mark 300 (the Y mark 320) in the Y direction. Then, the alignment processor 222 statistically processes the obtained positions of the alignment marks 300 for the individual directions, and transmits the result to the main controller 240.

Figure 3:
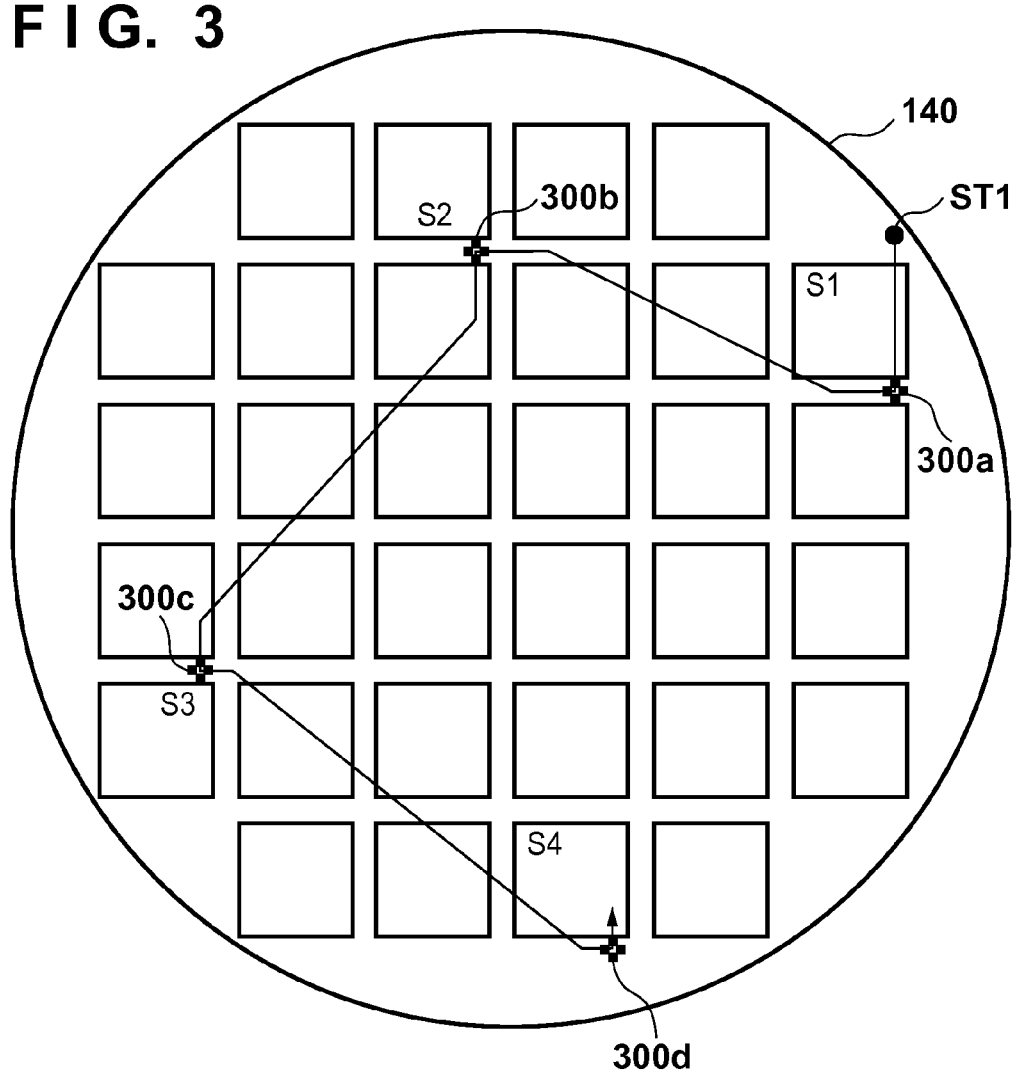
FIG. 3 is a view showing an example of the layout of a plurality of alignment marks formed on a substrate.

As described above, the plurality of alignment marks 300 are formed on the substrate 140, for example, four alignment marks 300a to 300d are formed as shown in FIG. 3. In FIG. 3, the substrate 140 on which the alignment marks 300a to 300d are formed includes shot regions S1 to S4. Referring to FIG. 3, the positions of the four alignment marks 300a to 300d are measured in order while the substrate stage 150 is moved step by step. Assume that the positions of the alignment marks 300a and 300b are measured in this order. In this case, the stage processor 232 controls the movement of the substrate stage 150 by accelerating and decelerating the substrate stage 150 so that the substrate stage 150 moves to the target position (mark position) within a minimum time. This movement of the substrate stage 150 to the target position is performed such that the main controller 240 designates the target position to the stage processor 232, and the stage processor 232 drives a motor 234 and applies servo while referring to an interferometer 236.

Next, the moving pattern of the substrate stage 150 and the charge timings of the image sensor 216 when sensing (detecting) images of the alignment marks 300a to 300d will be explained. More specifically, a case in which the substrate stage 150 is moved step by step from the shot region S2 to the shot region S3 and the image of the alignment mark 300c formed in the shot region S3 is sensed will be explained with reference to FIGS. 4A to 4E. Assume that the image of the alignment mark 300c is sensed four times in each of the X and Y directions.

FIG. 4A is a view showing the moving velocity of the substrate stage 150 in the Y direction in time series. In FIG. 4A, a moving velocity Vy of the substrate stage 150 in the Y direction is plotted on the ordinate, and a time T is plotted on the abscissa. FIG. 4B shows a residual error to the target position when the substrate stage 150 moves in the Y direction. In FIG. 4B, a residual error dPy is plotted on the ordinate, and the time T is plotted on the abscissa. FIG. 4C is a view showing the moving velocity of the substrate stage 150 in the X direction in time series. In FIG. 4C, a moving velocity Vx of the substrate stage 150 in the X direction is plotted on the ordinate, and the time T is plotted on the abscissa. FIG. 4D shows a residual error to the target position when the substrate stage 150 moves in the X direction. In FIG. 4D, a residual error dPx is plotted on the ordinate, and the time T is plotted on the abscissa. FIG. 4E is a view showing a charge term during which the image sensor 216 is charged with the image of the alignment mark 300c, and a processing term during which the position of the alignment mark 300c is obtained from the digital signals stored in the memory 224.

When the substrate stage 150 moves from the shot region S2 to the shot region S3, the moving distance in the X direction is shorter than that in the Y direction. Accordingly, the substrate stage 150 can reach the target position in the X direction earlier than that in the Y direction. Therefore, the substrate stage 150 is moved to the target position in the X direction before the alignment mark 300c enters the field of view of the scope 214. Consequently, the substrate stage 150 enters a field of view AR of the scope 214 while moving parallel to the Y direction, with respect to the alignment mark 300c (the shot region S3).

When the position of the substrate stage 150 in the Y direction has reached the field of view AR (±areay) of the scope 214, it is confirmed that the position of the substrate 150 in the X direction falls within the range of tolerance (±tolx) within which the alignment mark 300c can accurately be detected. If the position of the substrate stage 150 in the X direction falls within the range of tolerance (±tolx) within which the alignment mark 300c can accurately be detected, the image sensor 216 starts sensing (first charge) of the image of the alignment mark 300c.

Figure 5A:
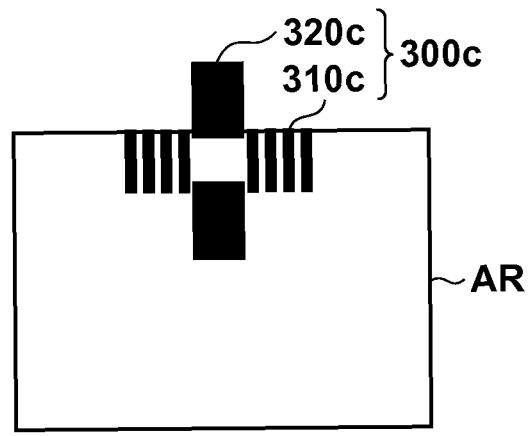
FIGS. 5A to 5C are views for explaining sensing of an image of the alignment mark by the image sensor.

In the first charge term, the image sensor 216 is charged with the image of the alignment mark 300c while the substrate stage 150 is moving in only the Y direction. In the alignment mark 300c as shown in FIG. 5A, therefore, the shape of a Y mark 320c flows, but an X mark 310c maintains its shape and can be imaged in this state. The first charge continues until the substrate stage 150 reaches the target position in the Y direction and stops in the range of tolerance (±toly) within which the alignment mark 300c can accurately be detected.

In this embodiment, the number of times of charge (the number of times of image sensing) is obtained from the relationship between the time obtained from the field of view AR (±areay) of the scope 214 and the moving velocity of the substrate stage 150 in the Y direction, and the charge time of the image sensor 216, which is predesignated by the main controller 240. More specifically, in the first charge term, the image sensor 216 senses the image of the alignment mark 300c twice (ct1 and ct2). However, it is also possible to predesignate the number of times of sensing performed on the image of the alignment mark 300c by the image sensor 216. Alternatively, it is possible to repetitively sense the image of the alignment mark 300c until the stage processor 232 notifies that the position of the substrate stage 150 in the Y direction has entered the range of tolerance (±toly).

The memory 224 stores the image of the alignment mark 300c sensed in the charge term ct1. Then, the alignment processor 222 obtains the position of the X mark 310c in the X direction from the image of the X mark 310c in the image of the alignment mark 300c sensed in the charge term ct1 (pt1). Similarly, the memory 224 stores the image of the alignment mark 300c sensed in the charge term ct2. The alignment processor 222 obtains the position of the X mark 310c in the X direction from the image of the X mark 310c in the image of the alignment mark 300c sensed in the charge term ct2 (pt2).

Figure 5B:
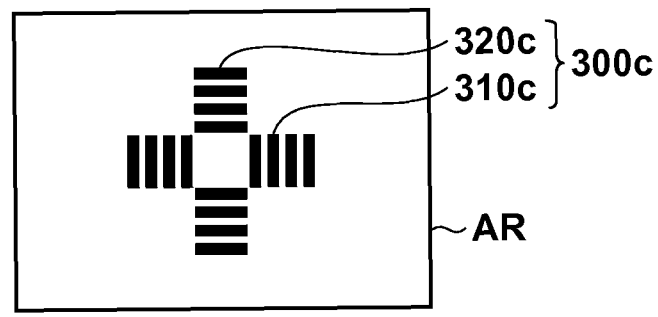

Subsequently, a second charge starts when the position of the substrate stage 150 in the Y direction stops in the range of tolerance (±toly). In the second charge term, the image sensor 216 is charged with the image of the alignment mark 300c while the substrate stage 150 is standing still (that is, the substrate stage 150 is not moving in the X and Y directions). As shown in FIG. 5B, therefore, the images of the X mark 310c and Y mark 320c of the alignment mark 300c can be sensed while the shapes of these marks are maintained. The number of times of charge (the number of times of sensing performed on the image of the alignment mark 300c by the image sensor 216) in the second charge term is determined by taking account of the number of times of charge in the third charge term.

Figure 5C:
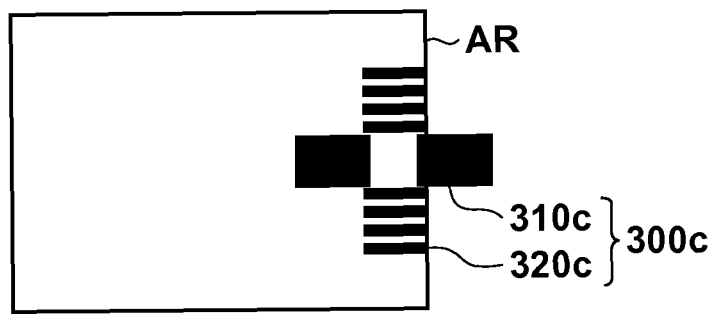

The third charge term is a term during which the substrate stage 150 moves parallel to the X direction, and the image sensor 216 is charged with the image of the alignment mark 300c while the substrate stage 150 is moving in only the X direction. In the alignment mark 300c as shown in FIG. 5C, therefore, the shape of the X mark 310c flows, but the image of the Y mark 320c can be sensed while the shape of the mark is maintained. The end timing of the third charge is the timing at which the position of the substrate stage 150 in the X direction comes out from the field of view AR (±areax) (comes outside the field of view) of the scope 214.

The number of times of charge in the third charge term can be obtained from the relationship between the time obtained from the field of view AR (±areax) of the scope 214 and the moving velocity of the substrate stage 150 in the X direction, and the charge time of the image sensor 216, which is predesignated by the main controller 240. More specifically, in the third charge period, the image sensor 216 senses the image of the alignment mark 300c twice (ct5 and ct6). In this embodiment, the image of the alignment mark 300c must be sensed four times in each of the X and Y directions, so the image sensor 216 senses the image of the alignment mark 300c twice in the second charge term (ct3 and ct4).

The memory 224 stores the image of the alignment mark 300c sensed in the charge term ct3. Then, the alignment processor 222 obtains the position of the X mark 310c in the X direction and the position of the Y mark 320c in the Y direction from the image of the alignment mark 300c sensed in the charge term ct3 (pt3). Likewise, the memory 224 stores the image of the alignment mark 300c sensed in the charge term ct4. The alignment processor 222 obtains the position of the X mark 310c in the X direction and the position of the Y mark 320c in the Y direction from the image of the alignment mark 300c sensed in the charge term ct4 (pt4).

Also, the memory 224 stores the image of the alignment mark 300c sensed in the charge term ct5. Then, the alignment processor 222 obtains the position of the Y mark 320c in the Y direction from the image of the Y mark 320c in the image of the alignment mark 300c sensed in the charge term ct5 (pt5). Analogously, the memory 224 stores the image of the alignment mark 300c sensed in the charge term ct6. The alignment processor 222 obtains the position of the Y mark 320c in the Y direction from the image of the Y mark 320c in the alignment mark 300c sensed in the charge term ct6 (pt6).

The positions (central position information) of the alignment marks 300a to 300d can be obtained by performing the processing as described above on all the alignment marks 300a to 300d. Global alignment is performed by using the central position information of each of the alignment marks 300a to 300d, and the pattern of the reticle 120 is transferred to the substrate 140 based on the position of each shot region on the substrate 140, which is obtained by the global alignment.

A method of determining the moving route of the substrate stage 150 between the alignment marks will be explained below. The moving route of the substrate stage 150 is determined based on the moving direction of the substrate stage 150 and the positions of the alignment marks 300, such that the moving time of the substrate stage 150, which is required to sense the images of the alignment marks 300 by the image sensor 216, becomes minimum.

Referring to FIG. 3, when the movement start point of the substrate stage 150 is, for example, ST1, the substrate stage 150 must be moved to minimize the moving time of the substrate stage 150 in the Y direction. For the alignment mark 300a, therefore, the substrate stage 150 is moved in the Y direction such that the alignment mark 300a enters the field of view AR of the scope 214. Also, the substrate stage 150 is moved in the X direction when starting movement (stepped movement) for measuring the next alignment mark from the alignment mark 300a.

The alignment marks 300b and 300d are possible candidates for the alignment mark as a position measurement target next to the alignment mark 300a. From the position of the alignment mark 300a, the movement of the substrate stage 150 is started in a direction (the X direction) perpendicular to the Y direction. Therefore, the alignment mark 300b is selected as an alignment mark as the next position measurement target in order to minimize the moving time of the substrate stage 150 between the alignment marks. This is so because the X-direction distance from the alignment mark 300a to the alignment mark 300b is longer than that from the alignment mark 300a to the alignment mark 300d. For the alignment mark 300b, the substrate stage 150 is moved in the X direction such that the alignment mark 300b enters the field of view AR of the scope 214.

The moving route of the substrate stage 150 is determined by the same method after that. In this embodiment, the final moving route of the substrate stage 150 is a route which connects the alignment marks 300a, 300b, 300c, and 300d in this order.

Figure 6:
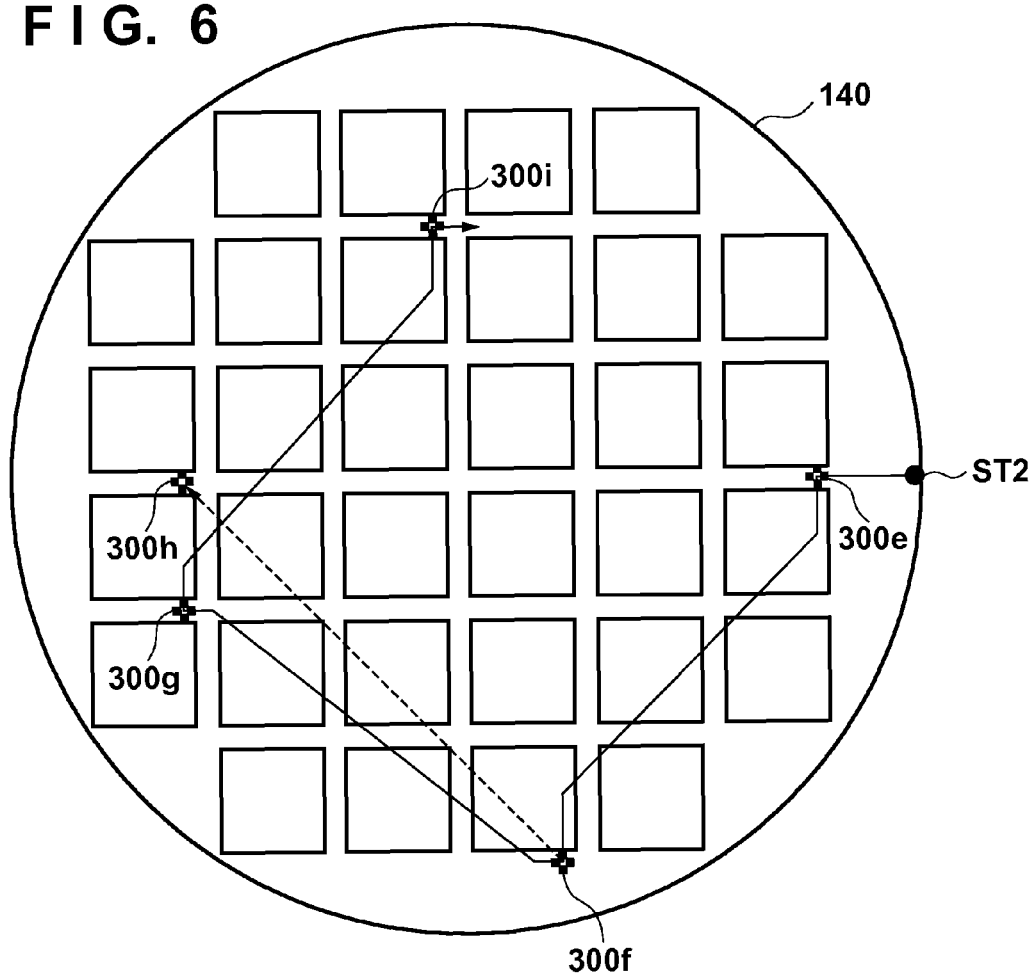
FIG. 6 is a view showing an example of the layout of a plurality of alignment marks formed on a substrate.

Also, when the movement start point of the substrate stage 150 is, for example, ST2 as shown in FIG. 6, the substrate stage 150 must be moved to minimize the moving time of the substrate stage 150 in the X direction. For an alignment mark 300e, therefore, the substrate stage 150 is moved in the X direction so that the alignment mark 300e enters the field of view AR of the scope 214. In addition, the substrate stage 150 is moved in the Y direction when starting movement (stepped movement) for measuring the next alignment mark from the alignment mark 300e.

Referring to FIG. 6, an alignment mark 300f is selected as the alignment mark as a position measurement target next to the alignment mark 300e. This is so because the Y-direction distance from the alignment mark 300e to the alignment mark 300f is longer than that from the alignment mark 300e to an alignment mark 300i.

Furthermore, alignment marks 300g and 300h are possible candidates for the alignment mark as a position measurement target next to the alignment mark 300f. The alignment marks 300f and 300h have a positional relationship of 45°. In this case, the substrate stage 150 can be moved at the highest velocity in both the X and Y directions, so the moving time of the substrate stage 150 between the alignment marks can be minimized by moving the substrate stage 150 in the direction of 45°. In this embodiment, however, for an alignment mark as the position measurement target next to the alignment mark 300f, the substrate stage 150 must be moved in the X direction so that this alignment mark enters the field of view AR of the scope 214. Accordingly, the alignment mark 300g is selected as an alignment mark as the position measurement target next to the alignment mark 300f.

The moving route of the substrate stage 150 is determined by the same method after that. In this embodiment, the final moving route of the substrate stage 150 is a route which connects the alignment marks 300e, 300f, 300g, and 300i in this order.

Thus, the moving route of the substrate stage 150 is determined (generated) based on the moving direction of the substrate stage 150 and the positional relationship (layout) between the alignment marks 300, so as to minimize the moving time of the substrate stage 150 between the alignment marks.

In the measuring apparatus 200, after a portion of the alignment mark 300 as a position measurement target enters the field of view AR of the scope 214, the image sensor 216 senses an image of the alignment mark while the substrate stage 150 is moved in a first direction (for example, the X direction). Then, the image sensor 216 senses the image of the alignment mark while the substrate stage 150 is moved in a second direction (for example, the Y direction) different from the first direction. Subsequently, the position of a second mark (Y mark) in the Y direction is obtained from an image of the Y mark in the image of the alignment mark sensed while the substrate stage 150 is moved in the first direction. Similarly, the position of a first mark (X mark) in the X direction is obtained from an image of the X mark in the image of the alignment mark sensed while the substrate stage 150 is moved in the second direction. Even when the alignment mark has position information in two directions, therefore, the measuring apparatus 200 can measure the position of the alignment mark while shortening the time during which the image of the alignment mark is sensed with the substrate stage 150 being at rest.

Also, in the measuring apparatus 200, the substrate stage 150 is preferably moved in the first direction (for example, the X direction) until an alignment mark as a position measurement target reaches a position (second position) in the field of view of the scope 214 from a position (first position) outside the field of view of the scope 214. Note that the substrate stage 150 is more preferably continuously moved in the first direction until the alignment mark as a position measurement target reaches the position in the field of view of the scope 214 from the position outside the field of view of the scope 214. During this movement, the time required to sense an image of the alignment mark can effectively be shortened by sensing the image of the alignment mark while the alignment mark is moving in the first direction in the field of view of the scope 214. However, a period before the alignment mark reaches the position outside the field of view of the scope 214 can include a period during which the substrate stage 150 is moved parallel to the first and second directions. In other words, when moving the substrate stage 150 step by step between the alignment marks, the substrate stage 150 can be moved in an oblique direction.

Also, as described above, the time necessary to move the substrate stage 150 between the alignment marks can be shortened by determining the moving route of the substrate stage 150 between the alignment marks so as to minimize the substrate stage moving time.

Figure 7:
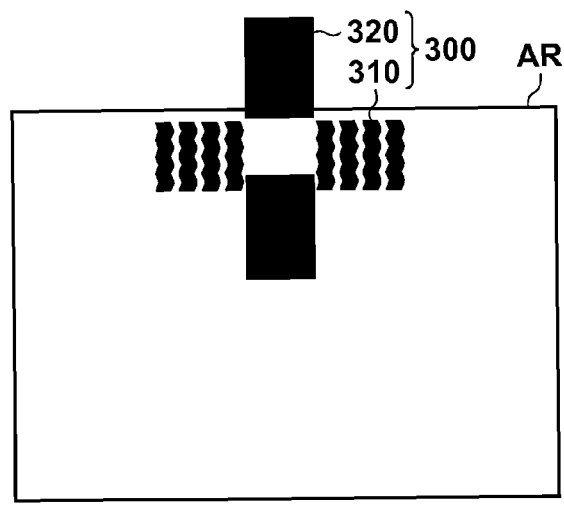
FIG. 7 is a view showing an example of an image of the alignment mark sensed by the image sensor.

The above explanation has been made based on the assumption that the substrate stage 150 has no shift or only a little shift in the measurement direction of the alignment mark 300. However, when sensing an image of the alignment mark 300 by the image sensor 216 while moving the substrate stage 150, the substrate stage 150 sometimes vibrates in the measurement direction of the alignment mark 300 due to the influence of the timing fluctuation of a signal such as jitter. In this case, an image of the alignment mark 300 sensed by the image sensor 216 is as shown in FIG. 7. The accuracy decreases if the position of the first mark 310 in the X direction is obtained from the image of the first mark 310 in the image of the alignment mark 300 as shown in FIG. 7.

If this is the case, an image of the alignment mark 300 to be sensed while the substrate stage 150 is moved (the first charge term) need only be sensed while the substrate stage 150 is standing still (the second charge term). The moving pattern of the substrate stage 150 and the charge timings of the image sensor 216 when sensing an image of the alignment mark 300 will be explained in detail below with reference to FIGS. 8A to 8E.

FIG. 8A is a view showing the moving velocity of the substrate stage 150 in the Y direction in time series. In FIG. 8A, the moving velocity Vy of the substrate stage 150 in the Y direction is plotted on the ordinate, and the time T is plotted on the abscissa. FIG. 8B shows a residual error to the target position when the substrate stage 150 moves in the Y direction. In FIG. 8B, the residual error dPy is plotted on the ordinate, and the time T is plotted on the abscissa. FIG. 8C is a view showing the moving velocity of the substrate stage 150 in the X direction in time series. In FIG. 8C, the moving velocity Vx of the substrate stage 150 in the X direction is plotted on the ordinate, and the time T is plotted on the abscissa. FIG. 8D shows a residual error to the target position when the substrate stage 150 moves in the X direction. In FIG. 8D, the residual error dPx is plotted on the ordinate, and the time T is plotted on the abscissa. FIG. 8E is a view showing a charge term during which the image sensor 216 is charged with the image of the alignment mark 300, and a processing term during which the position of the alignment mark 300 is obtained from the digital signals stored in the memory 224.

Assume that the substrate stage 150 suffers disturbance in the first charge term, and the residual error dPx to the target position when the substrate stage 150 moves in the X direction largely fluctuates as shown in FIG. 8C (NOISE). The stage processor 232 notifies the alignment processor 222 of the occurrence of the residual error dPx exceeding the tolerance (±tolx). The alignment processor 222 having received this notification determines that the accuracy may decrease if the position of the first mark 310 in the X direction is obtained from the image of the first mark 310 in the image of the alignment mark 300 sensed in the first charge term (ct1' and ct2'). Then, the alignment processor 222 invalidates the images of the alignment mark 300 sensed in the charge terms ct1' and ct2', and increases the number of times of charge (the number of times of sensing performed on the image of the alignment mark 300 by the image sensor 216) in the second charge term. More specifically, the image of the alignment mark 300 is sensed in each of charge terms ct3', ct4', ct5', and ct6' as the second charge term. The memory 224 stores the images of the alignment mark 300 sensed in the charge terms ct3' to ct6'. Then, the position of the first mark 310c in the X direction and the position of the second mark 320c in the Y direction are obtained from the images of the alignment mark 300c sensed in the charge terms ct3' to ct6' (pt3', pt4', pt5', and pt6'). Note that the substrate stage 150 is made to fall within the ranges of tolerances (±tolx and ±toly) until the charge term ct6' is over.

Thus, whether the image of the alignment mark sensed while the substrate stage 150 is moved in the first direction (that is, the X direction) is normal (that is, whether the image satisfies a tolerance (allowable condition)) is determined. If the image of the alignment mark is not normal, the image of the alignment mark to be sensed while the substrate stage 150 is moved in the first direction is sensed while the substrate stage 150 is at rest. In other words, if the substrate stage 150 vibrates in the alignment mark measurement direction, the residual error or the like to the target position of the substrate stage 150 is detected, and the image of the alignment mark is sensed again while the substrate stage 150 is standing still. This makes it possible to maintain the measurement accuracy for the position of the alignment mark while reducing the time necessary to measure the position of the alignment mark.

Figure 9A:
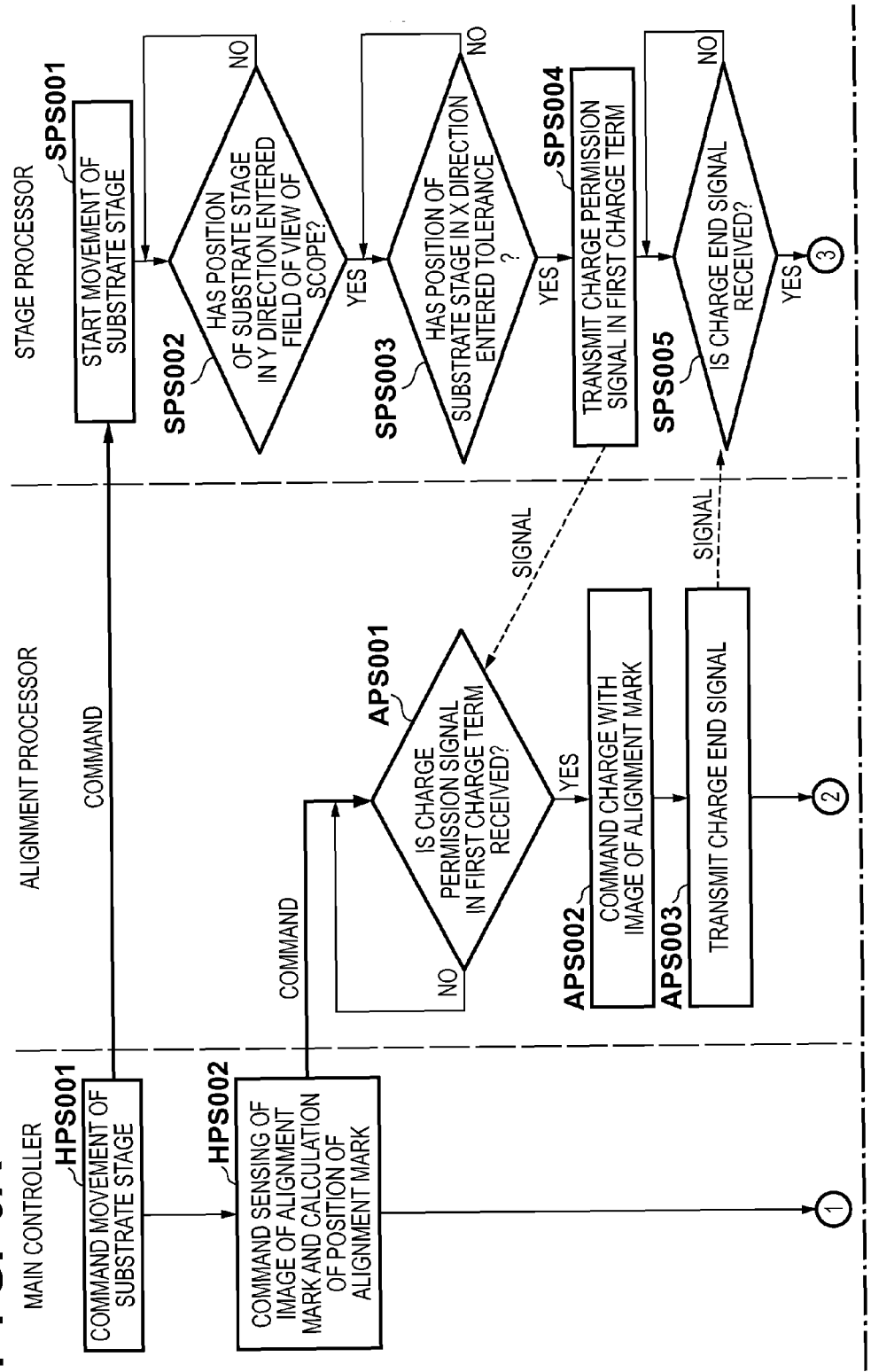
FIGS. 9A and 9B are views for explaining the flows of commands and information between a main controller, alignment processor, and stage processor in a measuring apparatus.
Figure 9B:
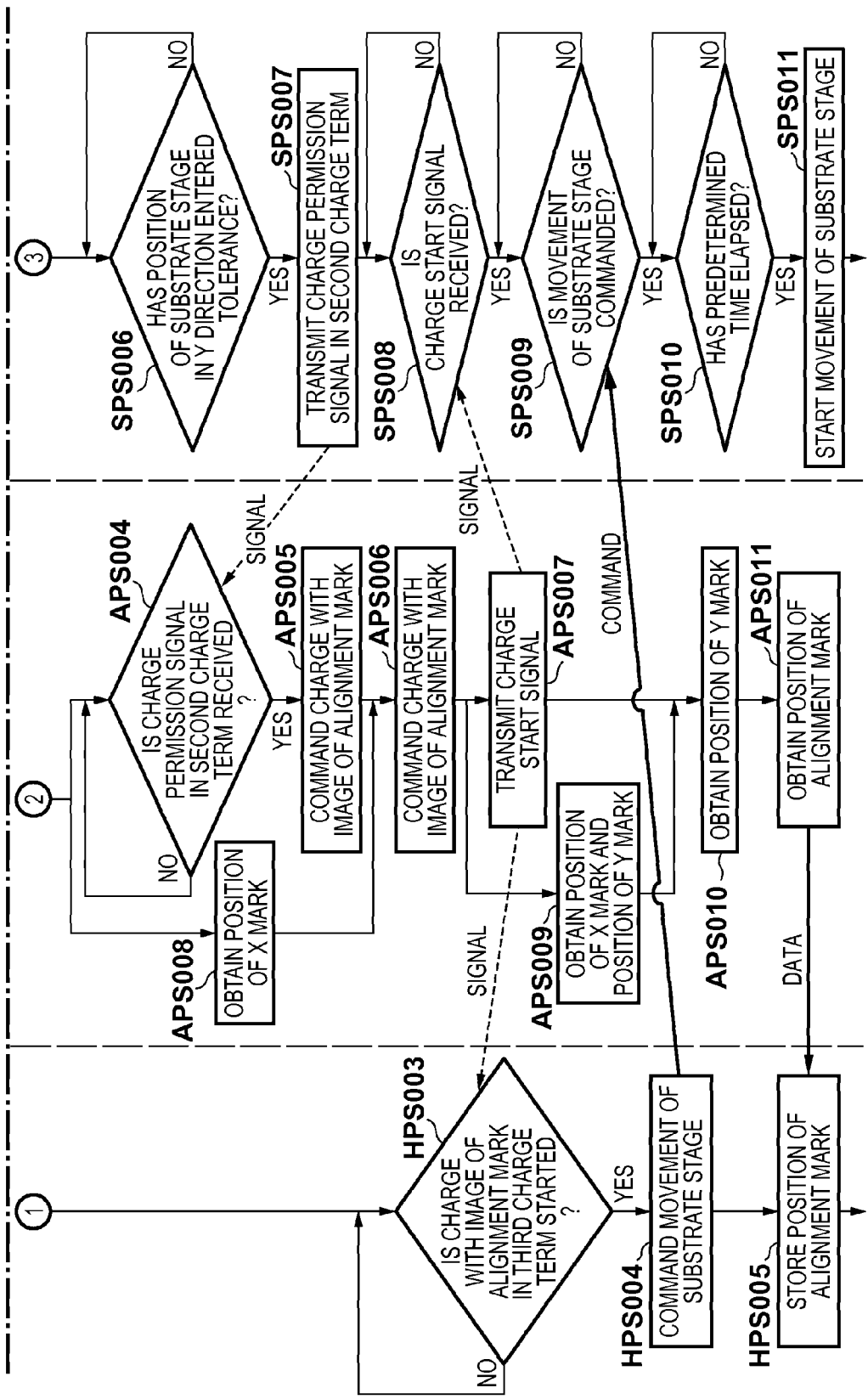

The flows of commands and signals between the main controller 240, alignment processor 222, and stage processor 232 in the measuring apparatus 200 will be explained below with reference to FIGS. 9A and 9B. More specifically, a case in which the substrate stage 150 is moved step by step from the shot region S2 to the shot region S3 and an image of the alignment mark 300c formed in the shot region S3 is sensed (see FIG. 3) will be explained.

The main controller 240 sends the mark coordinates of the alignment mark 300c formed in the shot region S3 to the stage processor 232, and commands the stage processor 232 to move the substrate stage 150 so that the alignment mark 300c enters the field of view AR of the scope 214 (step HPS001). When the alignment processor 222 has received a charge permission signal from the stage processor 232, the main controller 240 commands the alignment processor 222 to sense the image of the alignment mark and calculate the position of the alignment mark (step HPS002). As described previously, as the alignment mark image sensing command, the main controller 240 commands the alignment processor 232 to allow separate charge with the alignment mark image in the first, second, and third charge terms. Then, the main controller 240 determines whether the charge with the alignment mark image in the third charge term is started (step HPS003), and waits until the charge with the alignment mark image in the third charge term is started.

On the other hand, the stage processor 232 receives the command from the main controller 240, and starts moving the substrate stage 150 (step SPS001). Then, the stage processor 232 determines whether the position of the substrate stage 150 in the Y direction has entered the field of view of the scope 214 (step SPS002). If the position of the substrate stage 150 in the Y direction has entered the field of view of the scope 214, the stage processor 232 determines whether the position of the substrate stage 150 in the X direction has entered the tolerance within which the alignment mark is accurately detectable (step SPS003). If the position of the substrate stage 150 in the X direction has entered the tolerance, the stage processor 232 transmits, to the alignment processor 222, a charge permission signal which permits charge with the image of the alignment mark 300c in the first charge term (step SPS004). Subsequently, the stage processor 232 determines whether a charge end signal is received from the alignment processor 222 (step SPS005), and waits until this charge end signal is received.

The alignment processor 222 determines whether the charge permission signal in the first charge term is received from the stage processor 232 (step APS001). If the charge permission signal in the first charge term is received, the alignment processor 222 commands the image sensing controller 218 to allow charge with the image of the alignment mark 300c in the first charge term (step APS002). Consequently, the image sensor 216 starts charging the image of the alignment mark 300c in the first charge term. When the image of the alignment mark 300c allows charge a predetermined number of times for a predetermined charge time, the alignment processor 222 transmits a charge end signal to the stage processor 232 (step APS003). This charge end signal is a signal indicating that the charge with the image of the alignment mark 300c in the first charge term is ended. Also, the substrate stage 150 moves in only the Y direction in the first charge term, so it is possible to acquire the image of the alignment mark 300c by which the position (central position) of the X mark 310 can be obtained.

When receiving the charge end signal from the alignment processor 222, the stage processor 232 determines whether the position of the substrate stage 150 in the Y direction has entered the tolerance within which the alignment mark is accurately detectable (step SPS006). If the position of the substrate stage 150 in the Y direction has entered the tolerance, the stage processor 232 transmits, to the alignment processor 222, a charge permission signal which permits charge with the image of the alignment mark 300c in the second term (step SPS007). Then, the stage processor 232 determines whether a charge start signal is received from the alignment processor 222 (step SPS008), and waits until this charge start signal is received.

The alignment processor 222 determines whether the charge permission signal in the second charge term is received from the stage processor 232 (step APS004). If the charge permission signal in the second charge term is received, the alignment processor 222 commands the image sensing controller 218 to allow charge with the image of the alignment mark 300c in the second charge term (step APS005). Consequently, the image sensor 216 starts charging the image of the alignment mark 300c in the second charge term. When the image of the alignment mark 300c allows charge a predetermined number of times for a predetermined charge time, the alignment processor 222 commands the image sensing controller 218 to allow charge with the image of the alignment mark 300c in the third charge term (step APS006). Also, the alignment processor 222 transmits, to the stage processor 232 and main controller 240, a charge start signal indicating that the charge with the image of the alignment mark 300c in the third charge term is started (step APS007).

When receiving the charge start signal from the alignment processor 222, the stage processor 232 determines whether the main controller 240 has commanded the movement of the substrate stage 150 (step SPS009), and waits until the main controller 240 commands the movement of the substrate stage 150. On the other hand, when receiving the charge start signal from the alignment processor 222, the main controller 240 commands the movement of the substrate stage 150 such that the alignment mark 300d as a next position measurement target enters the field of view AR of the scope 214 (step HPS004).

The stage processor 232 receives the command from the main controller 240, and determines whether a predetermined time has elapsed by taking account of the charge time of the image of the alignment mark 300c in the third charge term (step SPS010). This step is performed in order to hold the alignment mark 300c in the field of view of the scope 214 until the charge with the image of the alignment mark 300c in the third charge term is ended. If the predetermined time has elapsed, the stage processor 232 starts moving the substrate stage 150 (step SPS011). In this step, the substrate stage 150 is moved in only the X direction in the field of view of the scope 214 in order to sense the image of the alignment mark by which the position in the Y direction can be obtained.

Also, in parallel with the processes in steps APS003 to APS005, the alignment processor 222 obtains the position of the X mark 310c in the X direction from the image of the alignment mark 300c which allows charge in the first charge term (step APS008). In the image of the alignment mark 300c which allows charge in the first charge term, as shown in FIG. 5A, the shape of the image of the X mark 310c is maintained, so the position of the X mark 310c in the X direction can be obtained.

Similarly, in parallel with the processes in steps APS006 and APS007, the alignment processor 222 obtains the position of the X mark 310c in the X direction and the position of the Y mark 320c in the Y direction from the image of the alignment mark 300c which allows charge in the second charge term (step APS009). In the image of the alignment mark 300c which allows charge in the second charge term, as shown in FIG. 5B, the shapes of the images of the X mark 310c and Y mark 320c are maintained. Therefore, it is possible to obtain the position of the X mark 310c in the X direction and the position of the Y mark 320c in the Y direction.

Furthermore, when the charge with the image of the alignment mark 300c in the third charge term is ended, the alignment processor 222 obtains the position of the Y mark 320c in the Y direction from the image of the alignment mark 300c (step APS010). In the image of the alignment mark 300c which allows charge in the third charge term, as shown in FIG. 5C, the shape of the image of the Y mark 320c is maintained, so the position of the Y mark 320c in the Y direction can be obtained.

The alignment processor 222 statistically processes the positions of the X mark 310c and Y mark 320c obtained in steps APS008 to APS010, thereby obtaining the position of the alignment mark 300c (step APS011). Also, the alignment processor 222 transmits the position of the alignment mark 300c to the main controller 240, and the main controller 240 stores the position of the alignment mark 300c received from the alignment processor 222 (step HPS005).

The operation of the exposure apparatus 100 will be explained below with reference to FIG. 10. In step S001, the substrate 140 is loaded into the exposure apparatus 100. The substrate 140 loaded into the exposure apparatus 100 is held on the substrate stage 150.

In step S002, pre-alignment is performed on the substrate 140 held on the substrate stage 150. In this pre-alignment, the measuring apparatus 200 measures two alignment marks of a plurality of alignment marks formed on the substrate 140 at a low magnification, and obtains the shift, magnification, rotation, and the like of the substrate 140. The pre-alignment is alignment necessary to perform global alignment.

In step S003, global alignment is performed on the substrate 140 having undergone the pre-alignment. In this global alignment, the measuring apparatus 200 measures the plurality of alignment marks formed on the substrate 140 at a high magnification, and statistically processes the positions of the alignment marks, thereby accurately obtaining the position of each shot region of the substrate 140.

In step S004, (each shot region of) the substrate 140 is exposed based on the position of each shot region of the substrate 140, which is obtained by the global alignment. More specifically, the pattern of the reticle 120 is transferred to the substrate 140 while the position of the substrate stage 150 holding the substrate 140 is controlled based on the measurement result from the measuring apparatus 200. In step S005, the substrate 140 on which all the shot regions are completely exposed is unloaded from the exposure apparatus 100.

In step S006, whether the exposure of all the substrates 140 is complete is determined. If the exposure of all the substrates 140 is not complete, the process returns to step S001, and a new substrate 140 to be exposed next is loaded into the exposure apparatus 100. If the exposure of all the substrates 140 is complete, the operation is terminated.

In the exposure apparatus 100, the measuring apparatus 200 measures the positions of the alignment marks formed on the substrate 140 in the pre-alignment (step S002) and global alignment (step S003). As described earlier, the measuring apparatus 200 can measure the positions of the alignment marks within a short time. Accordingly, the exposure apparatus 100 can perform alignment within a short time, and improve the throughput.

A method of manufacturing an article according to an embodiment of the present invention is suitable for manufacturing an article, for example, a microdevice such as a semiconductor device or an element having a microstructure. This manufacturing method includes a step of forming a pattern on a substrate coated with a photosensitive agent by using the exposure apparatus 100, and a step of processing (for example, developing) the substrate on which the pattern is formed. Following the above-mentioned formation step, the manufacturing method can also include other well-known steps (for example, oxidation, deposition, vapor deposition, doping, planarization, etching, resist removal, dicing, bonding, and packaging). The method of manufacturing an article according to this embodiment is more advantageous than any conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-185706 filed on Sep. 6, 2013, which is hereby incorporated by reference herein in its entirety.

What is claimed is:

1. A measuring apparatus for measuring a position of an alignment mark formed on a substrate and including a first mark having position information in a first direction and a second mark having position information in a second direction different from the first direction, the apparatus comprising:
   a stage configured to hold the substrate and to be movable;
   a detector configured to detect an image of the alignment mark;
   a controller configured to control movement of the stage and detection by the detector; and
   a processor configured to obtain a position of the alignment mark whose image is detected by the detector,
   wherein the controller is configured to cause the detector to detect the image of the alignment mark with the stage moving in the first direction, and cause the detector to detect the image of the alignment mark with the stage moving in the second direction,
   the processor is configured to obtain a position of the second mark in the second direction based on an image of the second mark detected by the detector with the stage moving in the first direction, and obtain a position of the first mark in the first direction based on an image of the first mark detected by the detector with the stage moving in the second direction,
   the controller is configured to cause the detector to detect the image of the alignment mark with the stage stopped in a second period between a first period during which the stage is moved in the first direction and a third period during which the stage is moved in the second direction, and
   the processor is configured to obtain the position of the second mark in the second direction based on the image of the second mark detected by the detector in the first period and the second period, and obtain the position of the first mark in the first direction based on the image of the first mark detected by the detector in the second period and the third period.

2. The apparatus according to claim 1, wherein the controller is configured to control the movement of the stage such that a period after which the alignment mark reaches the first position includes a period during which the stage is moved in the first direction and the second direction in parallel.

3. The apparatus according to claim 1, wherein the controller is configured to cause the detector to detect the image of the alignment mark in the second period if the image of the alignment mark detected by the detector in one of the first period and the third period does not satisfy a tolerance.

4. The apparatus according to claim 1, wherein the controller is configured to generate a moving route of the stage based on a layout of a plurality of target alignment marks formed on the substrate.

5. A lithography apparatus for forming a pattern on a substrate, the apparatus comprising:
   a measuring apparatus defined in claim 1 and configured to measure a position of an alignment mark formed on the substrate; and
   a stage configured to hold an original for forming the pattern.

6. The apparatus according to claim 5, further comprising a projection optical system,
   wherein the apparatus is configured to expose the substrate to light via the projection optical system to form, as the pattern, a latent image pattern on the substrate.

7. The apparatus according to claim 1, wherein the controller is configured to cause the detector to detect the image of the alignment mark of which the first direction and the second direction are perpendicular to each other.

8. The apparatus according to claim 1, wherein the controller is configured to cause the detector to detect the image of the alignment mark in which a plurality of the first marks are arranged along the first direction, and a plurality of the second marks are arranged along the second direction.

9. The apparatus according to claim 1, wherein the controller is configured to cause the detector to be charged with the image of the alignment mark while the alignment mark moves from the first position to the second position, and cause the detector to be charged with the image of the alignment mark while the alignment mark moves from the second position to the third position.

10. The apparatus according to claim 1, wherein the controller is configured to move the stage in the first direction such that the alignment mark moves from a first position outside a field of view of the detector to a second position inside the field of view and to move the stage in the second direction such that the alignment mark moves from the second position to a third position outside the field of view of the detector.

11. The apparatus according to claim 1, wherein the controller is configured to cause the detector to detect the image of the alignment mark with the stage stopped within a range of tolerance in the second period.

12. A measuring method of measuring a position of an alignment mark formed on a substrate and including a first mark having position information in a first direction and a second mark having position information in a second direction different from the first direction, the method comprising steps of:
  causing a detector to detect an image of the alignment mark with the substrate moving in the first direction, and causing the detector to detect the image of the alignment mark with the substrate moving in the second direction; and
  obtaining a position of the second mark in the second direction based on an image of the second mark detected by the detector with the substrate moving in the first direction, and obtaining a position of the first mark in the first direction based on an image of the first mark detected by the detector with the substrate moving in the second direction, wherein
  the causing step causes the detector to detect the image of the alignment mark with the stage stopped in a second period between a first period during which the stage is moved in the first direction and a third period during which the stage is moved in the second direction, and
  the obtaining step obtains the position of the second mark in the second direction based on the image of the second mark detected by the detector in the first period and the second period, and obtains the position of the first mark in the first direction based on the image of the first mark detected by the detector in the second period and the third period.

13. The method according to claim 12, wherein the first direction and the second direction are perpendicular to each other.

14. The method according to claim 12, wherein the detector is caused to detect the image of the alignment mark in which a plurality of the first marks are arranged along the first direction, and a plurality of the second marks are arranged along the second direction.

15. The method according to claim 12, wherein the detector is caused to be charged with the image of the alignment mark while the alignment mark moves from the first position to the second position, and the detector is caused to be charged with the image of the alignment mark while the alignment mark moves from the second position to the third position.

16. The method according to claim 12, wherein the causing step moves the substrate in the first direction such that the alignment mark moves from a first position outside a field of view of the detector to a second position inside the field of view and moves the substrate in the second direction such that the alignment mark moves from the second position to a third position outside the field of view of the detector.

17. The method according to claim 12, wherein the causing step causes the detector to detect the image of the alignment mark with the stage stopped within a range of tolerance in the second period.

18. A method of manufacturing an article, the method comprising:
  forming a pattern on a substrate using a lithography apparatus; and
  processing the substrate on which the pattern has been formed to manufacture the article,
  wherein the lithography apparatus includes a measuring apparatus, and a stage configured to hold an original for forming the pattern, and
  wherein the measuring apparatus is configured to measure a position of an alignment mark formed on the substrate and including a first mark having position information in a first direction and a second mark having position information in a second direction different from the first direction, and includes:
  a stage configured to hold the substrate and to be movable;
  a detector configured to detect an image of the alignment mark;
  a controller configured to control movement of the stage and detection by the detector; and
  a processor configured to obtain a position of the alignment mark whose image is detected by the detector,
  wherein the controller is configured to cause the detector to detect the image of the alignment mark with the stage moving in the first direction, and cause the detector to detect the image of the alignment mark with the stage moving in the second direction,
  the processor is configured to obtain a position of the second mark in the second direction based on an image of the second mark detected by the detector with the stage moving in the first direction, and obtain a position of the first mark in the first direction based on an image of the first mark detected by the detector with the stage moving in the second direction,
  the controller is configured to cause the detector to detect the image of the alignment mark with the stage stopped in a second period between a first period during which the stage is moved in the first direction and a third period during which the stage is moved in the second direction, and
  the processor is configured to obtain the position of the second mark in the second direction based on the image of the second mark detected by the detector in the first period and the second period, and obtain the position of the first mark in the first direction based on the image of the first mark detected by the detector in the second period and the third period.

* * * * *